United States Patent [19]

Yamamoto

[11] Patent Number: 5,485,597
[45] Date of Patent: Jan. 16, 1996

[54] A CCD ARRAY MEMORY DEVICE ACHIEVING HIGH SPEED ACCESSING BY WRITING AND READING DATA THROUGH A CACHE MEMORY

[75] Inventor: Makoto Yamamoto, Tokyo, Japan

[73] Assignee: Yozan Inc., Tokyo, Japan

[21] Appl. No.: 57,780

[22] Filed: May 6, 1993

[30] Foreign Application Priority Data

May 12, 1992 [JP] Japan .................................... 4-146552

[51] Int. Cl.[6] ............................. G06F 12/00; G06F 13/00
[52] U.S. Cl. ..................... 395/437; 395/436; 395/445; 395/421.09; 364/238.8; 364/238.7; 364/243.41; 364/244.4; 364/251.3; 364/926.4; 364/964.2; 364/DIG. 1; 364/DIG. 2; 365/73; 365/77; 365/78; 365/183; 365/240
[58] Field of Search ................................ 395/425, 436, 395/437, 445; 365/183, 77, 78, 240, 73, 238, 219; 364/238.7, 238.8, 244.4

[56] References Cited

U.S. PATENT DOCUMENTS

| | | | |
|---|---|---|---|
| 4,165,539 | 8/1979 | Aichelmann, Jr. ............... | 365/183 |
| 4,322,635 | 3/1982 | Redwine ............................ | 307/221 |
| 4,375,678 | 3/1983 | Krebs, Jr. .......................... | 365/238 |
| 4,388,701 | 6/1983 | Aichelmann, Jr. et al. ....... | 365/77 |
| 4,725,748 | 2/1988 | Hayes et al. ...................... | 307/607 |
| 5,168,463 | 12/1992 | Ikeda et al. ....................... | 365/78 |
| 5,317,540 | 5/1994 | Furuyama ......................... | 365/230.01 |

Primary Examiner—Tod R. Swann
Assistant Examiner—Frank J. Asta
Attorney, Agent, or Firm—Cushman Darby & Cushman

[57] ABSTRACT

A memory device for storing analog or multilevel data which is easy to produce and of a small scale. The memory device according to the present invention circulates data between a plurality of linear CCD arrays which store data as electrical charges, allows high speed memory access by reading and writing data through cache memory which stores row addresses corresponding to CCD arrays, and includes an address register for registering the address of cache memory data.

6 Claims, 3 Drawing Sheets

A CCD ARRAY MEMORY DEVICE ACHIEVING HIGH SPEED ACCESSING BY WRITING AND READING DATA THROUGH A CACHE MEMORY

FIELD OF THE INVENTION

The present invention relates to a memory device, especially to that effective for storing analog data or multilevel data.

BACKGROUND OF THE INVENTION

The reason why a digital computer has made progress as a programmable computer can be conceived that the size and the capacity of a digital memory has rapidly advanced into small and large, respectively, than an analog memory, But recently, it is close to the limit to produce higher density of digital LSI: the development of a digital computer has the limit without doubt. Conventionally, the scale of a circuit is large and the process of the production is complicated in order to realize a memory in analog or in multilevel.

SUMMARY OF THE INVENTION

The present invention solves the above-mentioned problems and has an object to provide a memory device for realizing an analog memory or a multilevel memory easy to produce and of small scale circuit.

A memory device according to the present invention realizes the small scale cell by means of storing analog data by circulating data on a plural number of linear CCD arrays, makes it possible to access in high speed by reading and writing data through cache memory, and by registering on an address register the address of the data in cache memory.

PREFERRED EMBODIMENT OF THE PRESENT INVENTION

Hereinafter, an embodiment of a memory device according to this invention is described with reference to the attached drawings.

Figure 1:
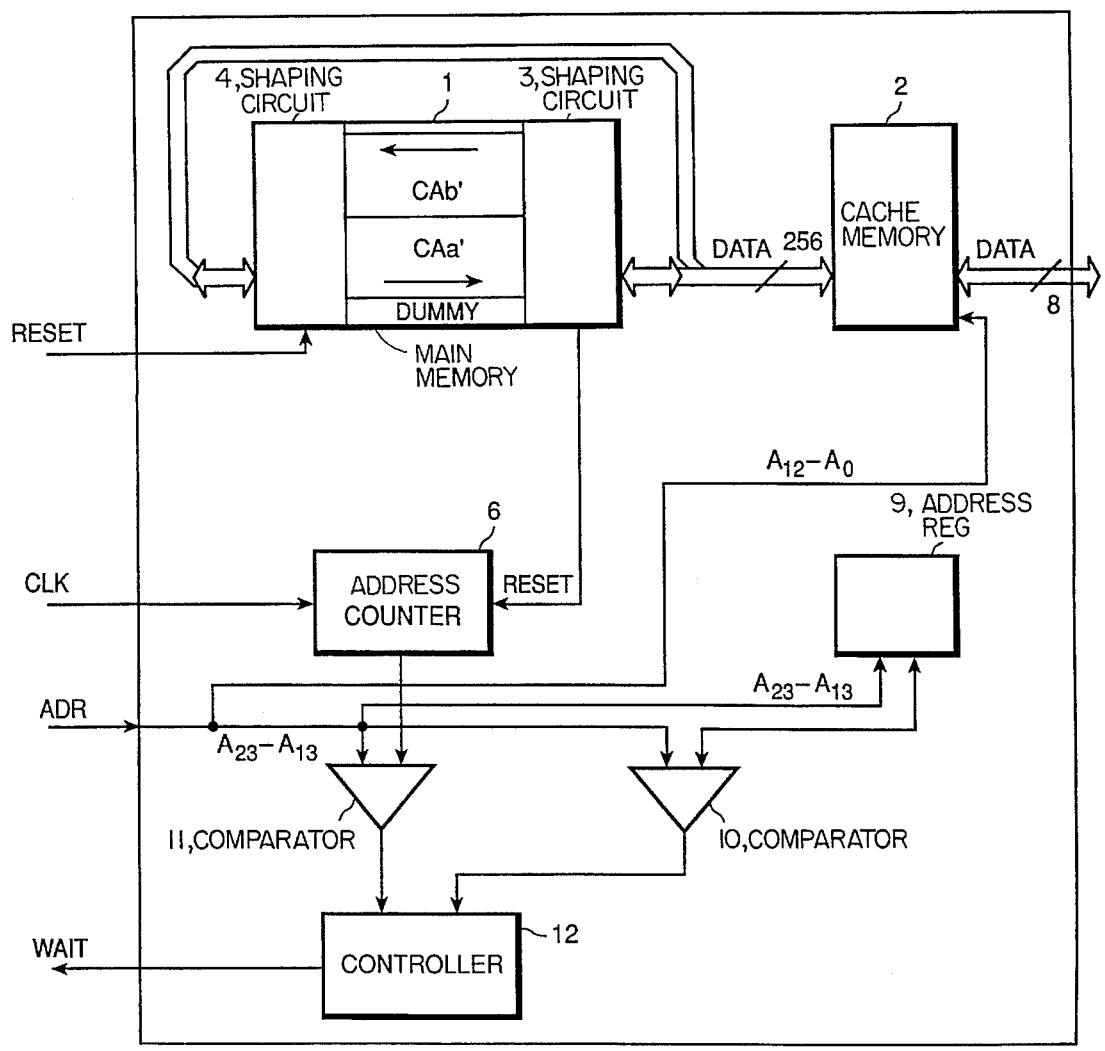
FIG. 1 shows a block diagram of an embodiment of a memory device according to the present invention.
Figure 2:
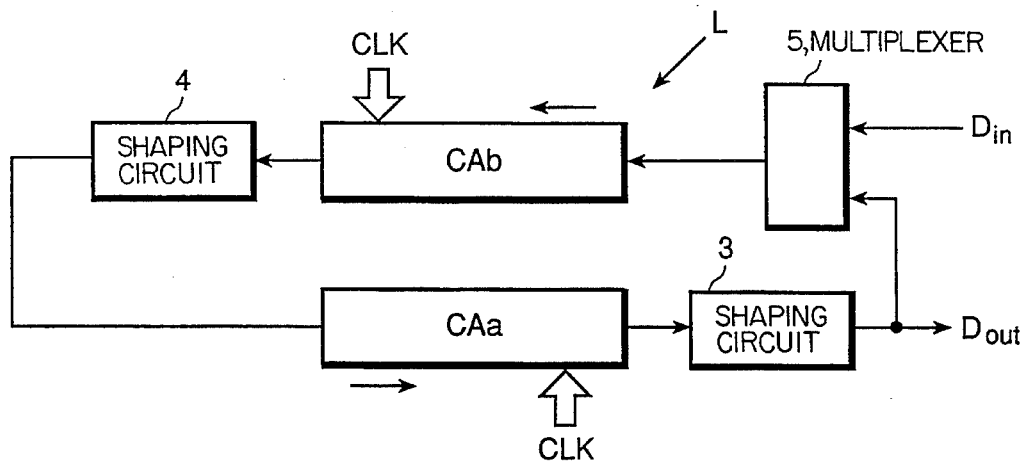
FIG. 2 shows a block diagram of a loop array of a CCD of the embodiment in FIG. 1.

FIG. 1 shows the whole circuit of the memory device. Main memory 1 and cache memory 2 are comprised in it.

In main memory 1, a plural number of looped CCD array "L" are connected in parallel. The CCD array is connected CCD array CAa by looping. The groups of CCD array CAa and CAb are expressed by CAa' and CAb', respectively, in FIG. 1. CCD array CAa transmits data to the end direction in keeping it, and CCD array CAb returns data to the start point in keeping it. Therefore, the CCD array keeps data in the whole of the circular root and has the capacity for twice scale of data than that for storing data in one way. It is also possible to simplify the circuit by forming the return root by simple conductor.

CCD array CAa and CAb connects shaping circuits 3 and 4, respectively, on their ends. Deteriorated data is restored by A/D converting function of these shaping circuits. The output of shaping circuit 3 is connected to CCD array CAb through multiplexer 5 for 2 inputs and new data can be written front Din. Branch Dout is set on the output of shaping circuit 3. Data can be read front the branch Dout. It is shown in FIG. 1 by "DATA". Generally, a CCD has more simpler structure than a cell of an usual DRAM. The necessary area for the storage of 1 datum is small and analog data can be stored in a cell. Therefore it is possible to realize a memory with more larger capacity than that of general DRAM.

Cache memory 2 is a high speed RAM for once storing data to read and write from/in main memory 1 (SRAM is usually used). It comprises row address from L1 to Ln of the numbers corresponding to each CCD array loop "L". It means that a unit of data of all array loops can be simultaneously transmitted from main memory 1 to cache memory 2, and vice versa. High speed of transmission is guaranteed by it.

The data of CCD array is transmitted by CLK and circulates on the loop array. A fixed address is commonly defined to all array loops. The address of the data on the end point of array CAa is given by address counter 6.

The address of a CCD array is always control led by address counter. In order to verify it, a dummy CCD array loop is set in the main memory (shown by "DUMMY" in FIG. 1) and the address of the main memory is registered on the array.

Figure 3:
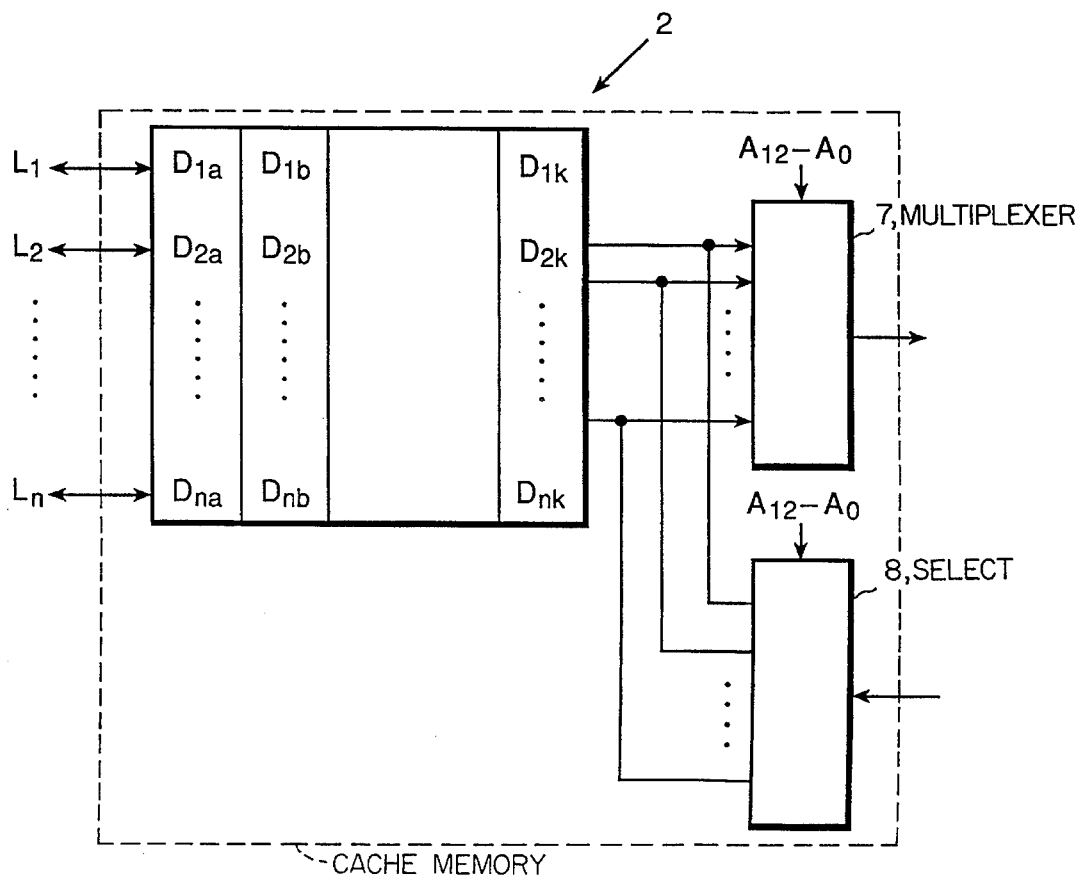
FIG. 3 shows a block diagram of a cache memory of the embodiment in FIG. 1.
Figure 4:
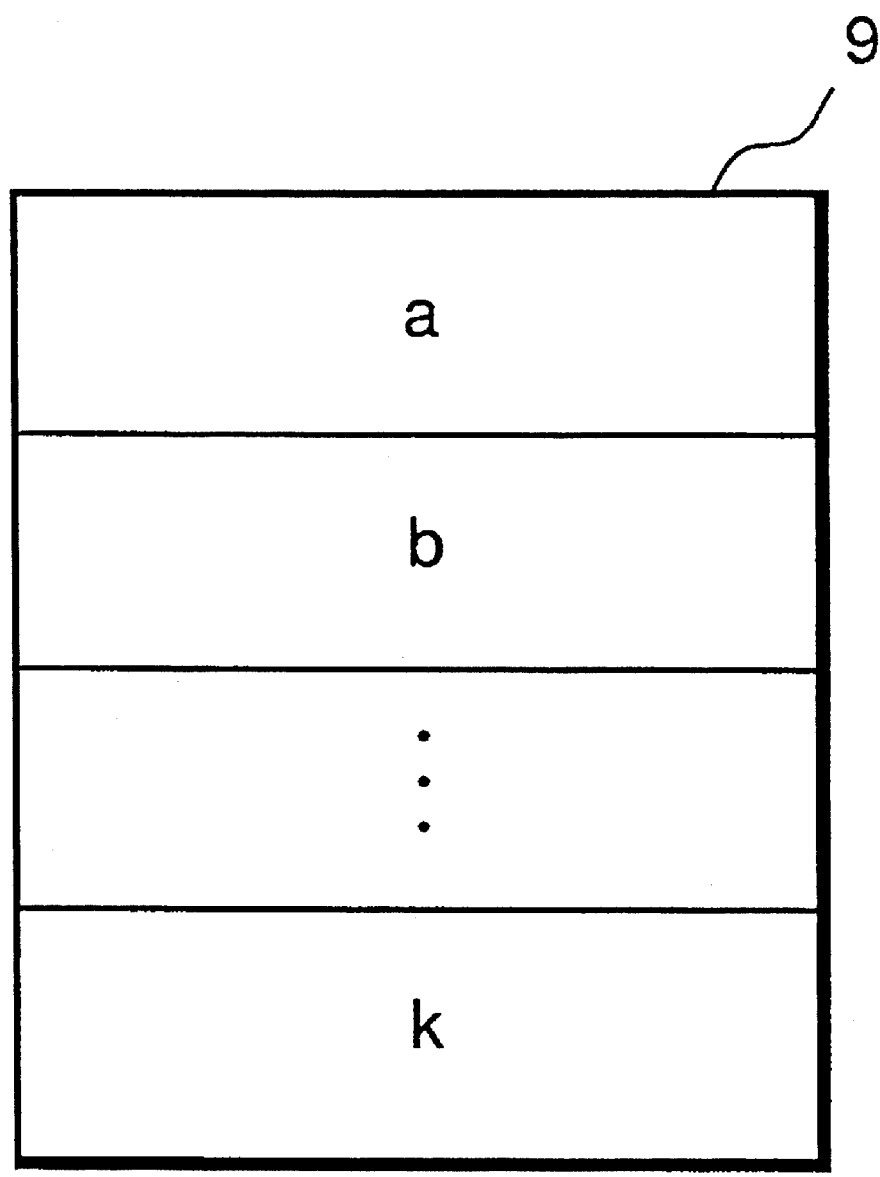
FIG. 4 shows an image of an address register of the embodiment in FIG. 1.

The addresses of multiplexer 7 and selector 8 are designated by inputting upper bits from $A_{23}$ to $A_{13}$ of ADR from outside of the device. As these upper bits address are simultaneously input to address register 9, the address of the data stored in the cache memory can be identified by checking the content in the address register. The check is executed by comparator 10 which is set by the same number of the addresses to be stored ("k", in FIGS. 3 and 4). The lower bits of ADR from $A_{12}$ to $A_0$ designated column addresses corresponding to the data of each row address. Reading and writing to a cache memory from outside is performed with respect to the designated column address.

When data is read and data does not exist in cache memory 2, it is necessary to write the required data in the cache memory after the data of transmitted to the end of CAa in main memory 1. Consequently, the address counter is input in comparator 11 and it is compared with $A_{23}$ to $A_{13}$.

When data is written and data does not exist in memory 12, only the column address of new data is overwritten on the oldest data in the cache memory, the required data in row address is transmitted to the cache memory from the main memory with the written address masked, and the composed data is back to the main memory.

The output of comparator 10 and 11 is input to controller 12. A wait signal WAIT is output from controller 12 in order to keep the waiting time for accessing a cache memory and for bringing data in case of no data is in a cache memory.

As mentioned, the memory device according to the present invention realizes the small scale cell by means of storing analog data by circulating data on a plural number of linear CCD array, makes it possible to access in high speed by reading and writing data through cache memory, and by registering on an address register the address of the data in cache memory. Therefore, it is possible to realize an analog memory or a multivalue memory with a small circuit.

What is claimed is:

1. A memory device comprising:

i) a plurality of CCD arrays, each array having a plurality of cells for storing data as electrical charges:

ii) a transmission clock for causing charges stored in cells in said plurality of CCD arrays to be successively shifted between said cells;

iii) a shaping circuit for shaping data on a first end of at least one of said plurality of CCD arrays;

iv) a feedback line for feeding shaped data back to a second end of a first one of said plurality CCD arrays;

v) a cache memory for storing row addresses, each row address corresponding to one of said plurality of CCD arrays;

vi) an address counter for designating a location of data in one of said plurality of CCD arrays as a column address by counting said transmission clock;

vii) an address register for registering a column address of data stored in said cache memory;

viii) one or more first comparators for comparing said column address in said address register with a new address and generating a first comparator output;

ix) a second comparator for comparing said new address and a count value of said address counter and generating a second comparator output; and x) a controller for generating a wait signal in response to said first comparator output and said second comparator output, said wait signal indicating that data corresponding to said new address is not present in said cache memory and suspending operation of said memory device until said data corresponding to said new address is transferred to said cache memory.

2. A memory device as claimed in claim 1, wherein each said CCD array comprises a first portion for receiving input data and a second portion for generating output data.

3. A memory device as claimed in claim 1, wherein each of said one or more first comparators corresponds to an address in said address register.

4. A memory device comprising:

CCD array means for circulating, responsive to a transmission clock signal, stored electrical charges representative of data, said CCD array means including a plurality of CCD arrays and a plurality of shaping elements disposed between said CCD arrays;

cache memory means for storing a portion of said electrical charges circulated in said CCD array means as digital data;

data verifying means for verifying address data representative of an address of one of said plurality of CCD arrays;

comparator means for comparing a portion of an address with an output of an address counter and with an address register to determine if data corresponding to said address is present or not present in said cache memory means, and generating a control signal to suspend operation of said memory device if said data corresponding to said address is not present in said cache memory means; and transmission clock means for generating said transmission clock signal.

5. The memory device of claim 4, wherein said comparator means includes a first comparator for comparing said portion of said address with said output of said address counter, a second comparator for comparing said portion of said address with said output of said address register, and a controller for receiving an output of said first comparator and an output of said second comparator, and for generating said control signal.

6. The memory device of claim 5, wherein said portion of said address comprises the upper bits of said address.

* * * * *

UNITED STATES PATENT AND TRADEMARK OFFICE
CERTIFICATE OF CORRECTION

PATENT NO. : 5,485,597
DATED : Jan. 16, 1996
INVENTOR(S) : YAMAMOTO

It is certified that error appears in the above-identified patent and that said Letters Patent is hereby corrected as shown below:

ON THE COVER PAGE:
Reads:

[73] Assignee: Yozan Inc., Tokyo, Japan

Should Read:

[73] Assignee: Yozan Inc., Tokyo Japan
                         Sharp Corporation, Osaka, Japan Signed and Sealed this Seventh Day of May, 1996

Attest:

BRUCE LEHMAN

*Attesting Officer*      *Commissioner of Patents and Trademarks*